United States Patent
Lips et al.

(10) Patent No.: US 10,241,163 B2
(45) Date of Patent: Mar. 26, 2019

(54) TEM RESONATOR SYSTEM ESPECIALLY FOR USE IN AN MRI SYSTEM

(71) Applicant: KONINKLIJKE PHILIPS N.V., Eindhoven (NL)

(72) Inventors: Oliver Lips, Hamburg (DE); Falk Uhlemann, Hamburg (DE); Volkmar Schulz, Wuerselen (DE)

(73) Assignee: KONINKLIKE PHILIPS N.V., Eindhoven (NL)

( * ) Notice: Subject to any disclaimer, the term of this patent is extended or adjusted under 35 U.S.C. 154(b) by 1014 days.

(21) Appl. No.: 14/405,298

(22) PCT Filed: May 14, 2013

(86) PCT No.: PCT/IB2013/053921
§ 371 (c)(1),
(2) Date: Dec. 3, 2014

(87) PCT Pub. No.: WO2013/182926
PCT Pub. Date: Dec. 12, 2013

(65) Prior Publication Data
US 2015/0130466 A1 May 14, 2015

Related U.S. Application Data

(60) Provisional application No. 61/655,552, filed on Jun. 5, 2012.

(30) Foreign Application Priority Data

Jun. 5, 2012 (EP) .................................... 12170785

(51) Int. Cl.
*G01R 33/345* (2006.01)
*G01R 33/34* (2006.01)
(Continued)

(52) U.S. Cl.
CPC ... *G01R 33/3456* (2013.01); *G01R 33/34076* (2013.01); *G01R 33/422* (2013.01);
(Continued)

(58) Field of Classification Search
CPC .......... G01R 33/34076; G01R 33/3453; G01R 33/3456; G01R 33/422; G01R 33/481;
(Continued)

(56) References Cited

U.S. PATENT DOCUMENTS 6,060,883 A 5/2000 Knuettel
7,218,112 B2 5/2007 Ladebeck
(Continued)

FOREIGN PATENT DOCUMENTS

JP 2011056164 A 3/2011
WO 2008037636 A1 4/2008
(Continued)

OTHER PUBLICATIONS

Weibler, Joseph, and Lindgren RF Enclosures. "Properties of Metals used for RF shielding." EMC Test and Design (1993): 100.*
(Continued)

*Primary Examiner* — Rishi R Patel

(57) ABSTRACT

A TEM resonator system includes at least two TEM resonators, especially in the form of TEM volume coils, and especially for use in an MR imaging system or apparatus for transmitting RF excitation signals and/or for receiving MR signals into/from an examination object or a part thereof, respectively. The TEM resonators are arranged and displaced along a common longitudinal axis, and an intermediate RF shield is positioned in longitudinal direction between the two TEM resonators for at least substantially preventing electromagnetic radiation from emanating from between the first TEM resonator and the second TEM resonator into the surroundings.

16 Claims, 6 Drawing Sheets

(51) Int. Cl.
*G01R 33/422* (2006.01)
*G01R 33/48* (2006.01)
*G01R 33/565* (2006.01)

(52) U.S. Cl.
CPC ........ *G01R 33/481* (2013.01); *G01R 33/3453* (2013.01); *G01R 33/5659* (2013.01); *G01R 33/56563* (2013.01)

(58) Field of Classification Search
CPC .......... G01R 33/56563; G01R 33/5659; G01R 33/34046; G01R 33/34; G01R 33/32
See application file for complete search history.

(56) References Cited

U.S. PATENT DOCUMENTS

| | | | |
|---|---|---|---|
| 7,522,952 | B2 | 4/2009 | Krieg |
| 7,667,457 | B2 | 2/2010 | Linz |
| 7,719,277 | B2 | 5/2010 | Eberler |
| 8,547,100 | B2 | 10/2013 | Solf et al. |
| 2007/0132454 | A1 | 6/2007 | Vaughan |
| 2007/0182414 | A1* | 8/2007 | Morich ............ G01R 33/34046 324/318 |
| 2008/0139924 | A1 | 6/2008 | Eberler |
| 2009/0146066 | A1* | 6/2009 | Renz ...................... A61B 6/037 250/363.04 |
| 2009/0206836 | A1 | 8/2009 | Eberler |
| 2009/0221903 | A1 | 9/2009 | Corbeil |
| 2010/0036237 | A1 | 2/2010 | Eberlein |
| 2010/0164492 | A1* | 7/2010 | Leussler ............ G01R 33/3415 324/307 |
| 2010/0219347 | A1 | 9/2010 | Schulz et al. |
| 2011/0288401 | A1* | 11/2011 | Solf ....................... A61B 6/037 600/411 |
| 2012/0169341 | A1* | 7/2012 | McKinnon ............. A61B 6/037 324/318 |
| 2014/0253122 | A1* | 9/2014 | Leussler ............ G01R 33/4215 324/309 |

FOREIGN PATENT DOCUMENTS

| | | |
|---|---|---|
| WO | 2009004521 A2 | 1/2009 |
| WO | 2010095063 A1 | 8/2010 |

OTHER PUBLICATIONS

P. Vernickel et al., An Eight-channel 3D-segmented RF Coil for Parallel Transmission at 3T, Proc. Intl. Soc. Mag. Reson. Med. 15 (2007) p. 167.

* cited by examiner

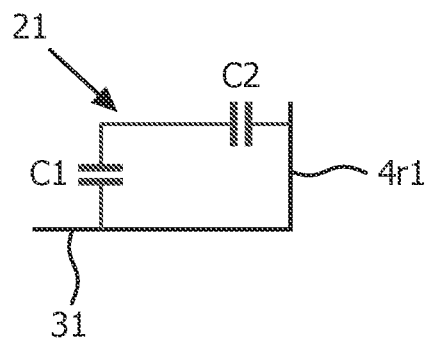
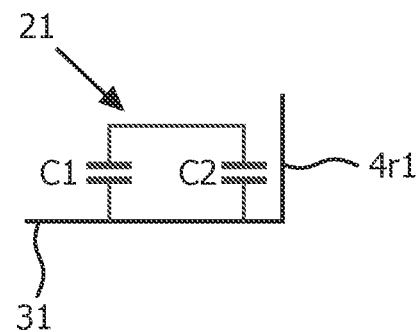
FIG. 7A                FIG. 7B
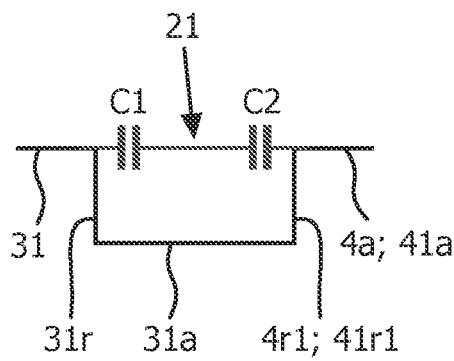
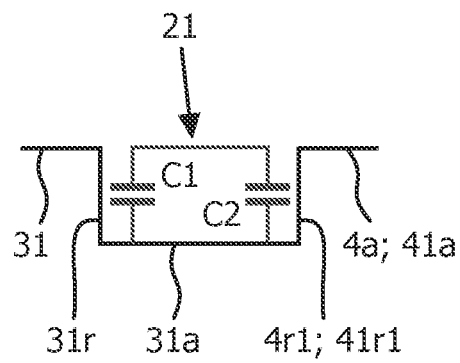
FIG. 7C                FIG. 7D
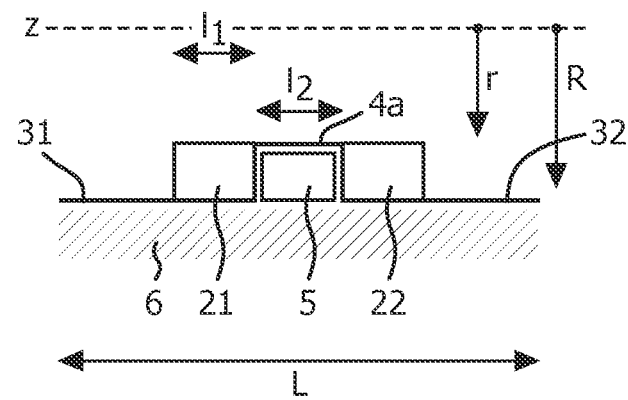
FIG. 8

TEM RESONATOR SYSTEM ESPECIALLY FOR USE IN AN MRI SYSTEM

CROSS-REFERENCE TO PRIOR APPLICATIONS

This application is the U.S. National Phase application under 35 U.S.C. § 371 of International Application No. PCT/IB2013/053921, filed on May 14, 2013, which claims the benefit of U.S. Provisional Patent Application No. 61/655,552, filed on Jun. 5, 2012 and European Patent Application No. 12170785.5, filed on Jun. 5, 2012. These applications are hereby incorporated by reference herein.

FIELD OF THE INVENTION

The invention relates to a TEM resonator system comprising at least two TEM resonators, each especially in the form of TEM volume coils, and especially for use in an MR imaging system or apparatus for transmitting RF excitation signals and/or for receiving MR signals into/from an examination object or a part thereof, respectively.

Further, the invention relates to an MR imaging system or apparatus in the form of a horizontal (axial) system comprising such a TEM resonator system.

BACKGROUND OF THE INVENTION

As generally known, in an MR imaging (MRI) system or MR scanner, an examination object, usually a patient, is exposed to a uniform main magnetic field ($B_0$ field) so that the magnetic moments of the nuclei within the examination object form a certain net magnetization of all nuclei parallel to the $B_0$ field, which can be tilted leading to a rotation around the axis of the applied $B_0$ field (Larmor precession). The rate of precession is called Larmor frequency which is dependent on the specific physical characteristics of the involved nuclei, namely their gyromagnetic ratio, and the strength of the applied $B_0$ field. The gyromagnetic ratio is the ratio between the magnetic moment and the spin of a nucleus.

By transmitting an RF excitation pulse ($B_1$ field) which is orthogonal to the $B_0$ field, generated by means of an RF transmit antenna or coil, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state, wherein T1 and T2 are the times required for the longitudinal and transversal magnetization, respectively, to return to 63% of their equilibrium values. MR signals which are generated by the precessing magnetization, are detected by means of an RF receive antenna or coil. The received MR signals which are time-based amplitude signals, are then Fourier transformed to frequency-based MR spectrum signals and processed for generating an MR image of the nuclei of interest within an examination object.

In order to obtain a spatial selection of a slice or volume within the examination object and a spatial encoding of the received MR signals emanating from a slice or volume of interest, gradient magnetic fields are superimposed on the $B_0$ field, having the same direction as the $B_0$ field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed $B_0$ field, so that by appropriately tuning the frequency of the transmitted RF excitation pulse (and by accordingly tuning the resonance frequency of the RF/MR receive antenna), and by accordingly controlling the gradient magnetic fields, a selection of nuclei within a slice at a certain location along each gradient in the x-, y- and z-direction, and by this, in total, within a certain voxel of the object can be obtained.

The above RF (transmit and/or receive) antennas can be provided both in the form of so-called body coils (also called whole body coils) which are fixedly mounted within an examination space of an MRI system for imaging a whole examination object, and as so-called surface or local coils which are arranged directly on or around a local zone or area to be examined and which are constructed e.g. in the form of flexible pads or sleeves or cages like head coils.

Further, such RF transmit and/or receive antennas can be realized on the one hand in the form of an RF antenna array or array coil, which comprises a number of individual coils or coil elements which are individually selected for being driven by an own RF current source in order to generate (and/or receive) their own local magnetic field such that a desired overall magnetic field distribution is generated within (or received from) the examination space by all coil elements together. However, this requires that the individual coils or coil elements are electromagnetically decoupled from each other, or the mutual couplings (mainly due to magnetic flux) between the elements are compensated.

On the other hand, such RF transmit and/or receive antennas can be realized in the form of an RF resonator, especially an RF volume resonator, also called RF volume coil, which comprises a conductor structure with a number of conductor elements which electromagnetically couple to each other such that by driving the RF resonator at one or two ports by an RF current source, a number of linearly independent resonant current distributions ("resonant modes") can be excited in the RF resonator for generating magnetic fields at certain resonance frequencies in a volume of interest (usually an examination space).

Such RF resonators are known especially in the form of birdcage type RF coils and TEM type coils. Both can comprise a conductor structure in the form of a number of longitudinal conductor elements which are arranged in parallel to each other in a cylindrical pattern having a circular or an oval or elliptical or other cross sectional shape such that a substantially cylindrical volume for receiving an examination object or a part thereof is enclosed by the conductor structure. The longitudinal conductor elements are usually rungs or strip lines (especially each in the form of a longitudinal conductive coating on a printed circuit board or another carrier) which in case of a birdcage type RF coil are conventionally galvanically connected to each other at both axial ends of the coil e.g. by means of electrically conducting end caps or circular or oval or elliptical or other electrical loop conductors. Preferably, a cylindrical RF shield is provided which coaxially surrounds the conductor structure and is disconnected from the same, wherein the RF shield is provided for preventing the surroundings from being exposed to the RF fields generated within the birdcage type RF coil.

In case of a TEM type coil, the longitudinal conductor elements are usually not galvanically connected to each other. Instead, the conductor elements are coupled at their axial ends and/or at one or more positions along their length by means of one or more capacitors (or galvanic conductors) to an especially cylindrical RF shield which preferably has the same cross sectional shape as the cylindrical pattern of the conductor structure and which coaxially surrounds the conductor structure in a known manner. Consequently, and in contrary to a birdcage type RF coil, this (outer) cylindrical RF shield functions as an active element which provides a return path for the currents in the (inner) longitudinal conductor elements. By this, the TEM resonator substantially behaves like a longitudinal multi-conductor transmission line which is capable of supporting standing waves at certain resonance frequencies. A separation of the resonance modes can be obtained by adjusting mutual couplings between the (inner) conductor elements, wherein by adjusting the capacitances of the capacitors which couple the conductor elements to the RF shield, the RF field distribution within the TEM resonator can be adjusted for obtaining the best field homogeneity. Again, the cross sectional shape of a TEM type coil (TEM resonator) can be circular or oval or elliptical or can have other shapes.

WO 2008/037636 (US 2010/0036237) discloses a detector unit for arrangement within a magnet field generating unit of an MRI device, comprising an RF/MR transceiver system in the form of a birdcage resonator which is divided into two part systems which are spaced apart from one another in the direction of the tunnel axis so as to form an essentially annular cavity between them. The detector unit further comprises an RF screen for shielding the RF/MR transceiver system to the outside. The cavity between the two part systems is provided for receiving a supplementary element for influencing the main magnetic field or the gradient magnet fields, or a PET detector, wherein such an element or detector is arranged in a radial direction outside of the RF screen.

SUMMARY OF THE INVENTION

It has revealed that the profile of the RF field strength and especially its homogeneity is detrimentally influenced by such a dividing of a birdcage coil into two axially separated part systems.

One object underlying the invention is to provide an RF resonator system by means of which a more homogeneous RF field profile can be generated, and which is especially suitable for arranging a supplementary element like a PET detector system, in close proximity to the RF resonator system without detrimentally influencing the homogeneity of the RF field profile of the TEM resonator system to a substantial extent.

A first and a second TEM resonator (and possibly a third and further TEM resonators) are arranged and displaced from each other along a common longitudinal axis (i.e. the z-axis). An intermediate section is provided between both (i.e. each two adjacent) TEM resonators in which a supplementary element, for example a PET detector system or any other system or element especially for adding to or supporting an MR image generation can be arranged in close proximity to the examination object.

By providing an intermediate RF shield (i.e. an RF shielding structure or RF screened area) in this intermediate section, it is prevented that electromagnetic RF energy which is generated by means of the first and the second TEM resonator for MR image generation is emanating outward, i.e having a component propagating in the radial direction from the common longitudinal axis through the intermediate section into the surroundings. The shapes and dimensions in cross sections of the intermediate RF shield and its axial length is selected such that electromagnetic energy which is generated within the TEM resonators is shielded against radiating outward into the surroundings of the TEM resonator system to a desired extent and, if provided, such that a supplementary element can be positioned axially between both adjacent TEM resonators, i.e. within the intermediate section.

Generally, the supplementary element can be positioned in the radial direction inside or outside the intermediate RF shield, depending on the kind of the supplementary element.

The TEM resonator system according to the invention can be realized both in the form of a whole body resonator and in the form of a so-called surface or local resonator like a head coil etc. as explained above.

Generally, the shapes and the dimensions in cross sections of the first and of the second RF shields (and of the RF shield of any further TEM resonator, if provided) are selected as generally known (e.g., circular or oval etc.), wherein these shapes and/or dimensions in cross sections can be the same or can be different at any positions along the (common) longitudinal axis of the related first and second RF shields. The same accordingly applies for the axial lengths of the first and the second RF shields.

Further, the shapes and/or dimensions in cross sections and/or the axial length of the first RF shield can be the same or different as the shapes and/or dimensions in cross sections and the axial length, respectively, of the second (and of any possible further) RF shield. If e.g. the first RF shield has a larger extension in cross section (especially a larger diameter) than the second RF shield, and no supplementary element is desired to be positioned within the intermediate section, the intermediate RF shield can be realized in the form of a radial ring only with a related inner and outer diameter according to the diameters of the first and the second RF shield, respectively, in order to prevent the above radiation of electromagnetic energy into the surroundings.

All the above accordingly applies in case of polygon cross sections of the first and/or second RF shields and the resulting polygon cross section of the intermediate RF shield.

Finally, the TEM resonator system according to the invention can also be used for transmitting and/or for receiving RF signals for other applications than MR imaging.

One advantage is a substantial electromagnetic decoupling of the TEM resonators is obtained, which allows the conducting of a multi-element transmit/receive imaging in the axial (z−) direction by independently supplying the two (or more) TEM resonators with RF currents which are different from each other with respect to at least one of their frequency, phase, amplitude and pulse shape, if desired. On the other hand, the TEM resonators can also be supplied with the same RF currents, as a result of which the TEM resonators generate (or receive) an RF field substantially as in the case when the TEM resonators were electromagnetically coupled with each other, i.e. working as one TEM resonator.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

BRIEF DESCRIPTION OF THE DRAWINGS

FIG. 7 shows details of the embodiments of the TEM resonator systems shown in FIG. 6;

FIG. 8 shows a partial longitudinal section through the TEM resonator system according to FIG. 2;

DETAILED DESCRIPTION OF EMBODIMENTS

Figure 1:
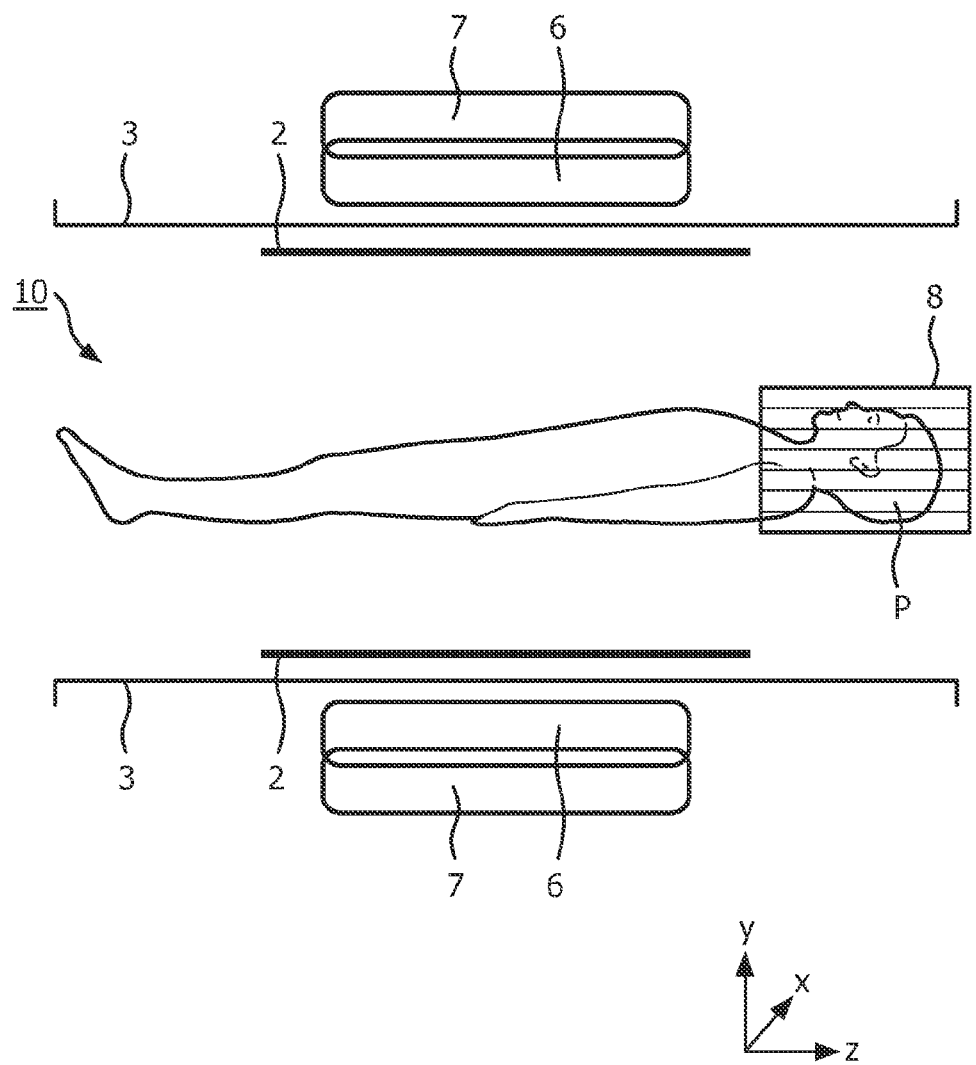
FIG. 1 shows a diagrammatic cross section of an axial MRI system.

FIG. 1 generally shows a longitudinal section of substantial components of an exemplary conventional horizontal magnetic resonance imaging (MRI) system or a magnetic resonance (MR) scanner having an axial (i.e. horizontal) examination zone 10 for introducing an examination object P. In the following, the longitudinal direction is the direction of the z-axis or axial direction in case of such a horizontal MRI system.

The examination zone 10 is surrounded by an at least substantially cylindrical whole body TEM resonator comprising an axially extending cylindrical conductor structure 2 and a cylindrical RF shield 3 which coaxially surrounds the cylindrical conductor structure 2 and is capacitively or galvanically coupled to the same as explained above and generally known. As further explained above, the TEM resonator 2, 3 serves for transmitting RF excitation pulses ($B_1$ field) at the MR frequencies into, and/or for receiving MR signals from the examination zone 10 or a volume of interest. Such a TEM resonator can be replaced by a TEM resonator system according to the invention.

Around the TEM resonator 2, 3 there is arranged in a known manner a gradient coil system 6 by means of which the three gradient magnetic fields in the orthogonal x-, y- and z-directions are generated as explained above for the spatial selection and spatial encoding of the received MR signals emanating from the excited nuclei of interest.

Further, at the gradient coil system 6, a main magnet system 7 is arranged in a known manner for generating an essentially uniform main magnetic field ($B_0$ field) for aligning the nuclear spins in the object P to be examined as generally known.

FIG. 1 schematically also shows a local TEM resonator 8 exemplarily in the form of a head coil which also comprises a conductor structure and an RF shield (only schematically indicated) configured as explained above and which can also be realized in the form of a TEM resonator system according to the invention. Finally, other local TEM resonator systems according to the invention can be provided for being arranged directly on or around a zone or specific region of interest of the object P to be examined.

Generally, a TEM resonator system according to the invention comprises at least two TEM resonators, preferably a first and a second TEM resonator, which are arranged and displaced from each other along their common longitudinal axis, i.e. the z-axis, so that an intermediate section between both (each adjacent) TEM resonators is created. The TEM resonators are at least substantially electromagnetically decoupled from each other by means of an RF shield or an RF shielding structure (in the following commonly called "intermediate RF shield"), which is arranged in the intermediate section.

Preferably, at least one supplementary element for conducting or supporting an image generation of an examination object, like e.g. a PET (Positron Emission Tomography) detector arrangement is also arranged within the intermediate section, i.e. between the related two adjacent TEM resonators.

Generally, the configuration of the TEM resonators, especially of the conductor structures and the RF shields, can be provided as generally known, each in the same or in different ways as desired.

The TEM resonators each comprise a preferably cylindrical conductor structure having a circular or an oval or elliptical or other cross sectional shape as explained above and a cylindrical RF shield which preferably has the same cross sectional shape as the conductor structure and which coaxially surrounds the conductor structure as explained above, wherein again the conductor structure is capacitively or galvanically coupled to the RF shield as generally known and explained above. Preferably, the conductor structure and/or the RF shield of the first TEM resonator has the same cross sectional shapes and/or the same axial length and/or dimensions in cross section as those of the second TEM resonator.

Preferably, the conductors of one or both of the adjacent TEM resonators are arranged with one of their ends proximal to the intermediate section and have a length in the longitudinal direction (i.e. the axial or z-direction of the TEM resonator system) which is shorter than the axial length of the related RF shield.

Generally, the axial length of the intermediate RF shield (and by this the axial length of the intermediate section) and/or the cross sectional shape of the intermediate RF shield is formed, and/or the dimensions thereof in cross section are selected, respectively, for obtaining or increasing an electromagnetic decoupling of the adjacent TEM resonators from each other to a desired extent, and/or, if desired, for receiving the at least one supplementary element. The same accordingly applies for the shape of the intermediate RF shield in the longitudinal direction, wherein this shape is preferably the same in any of the circumferential directions.

Preferably, the intermediate RF shield galvanically connects the RF shields of the adjacent TEM resonators to a common RF shield of the TEM resonator system.

Further, the intermediate RF shield preferably has the same cross sectional shape as the RF shields of the adjacent TEM resonators, i.e. it is preferably cylindrical (or conical or cone-shaped etc.) and has a circular or an oval or an elliptical or other cross sectional shape. However, it can have the same or greater or smaller dimensions in cross section as the RF shields of the adjacent TEM resonators.

In order to obtain a certain shape of the intermediate RF shield in the longitudinal direction (i.e. in the longitudinal section), the intermediate RF shield is preferably composed along its axial direction (i.e. the z-axis) of two or more ring sections which each have the same or different axial lengths and/or which have the same or different diameters and/or the same or different shapes in the longitudinal section and/or in the cross section. Generally, such a ring section can be a longitudinal ring having a certain diameter and a longitudinal extension in the direction of the z-axis, or a radial ring like a disk which has substantially no length in the direction of the z-axis but an inner and an outer diameter, i.e. a radial extension.

Finally, the intermediate RF shield can be dimensioned with respect to its length and shape in axial direction (z-direction) and/or its cross sectional shape and dimensions for receiving a supplementary element which can be arranged e.g. at the radial inner or at the radial outer side of the intermediate RF shield.

All the above accordingly applies for all of the following and other embodiments and shall not be repeated in detail in connection with the explanation of the following embodiments.

Figure 2:
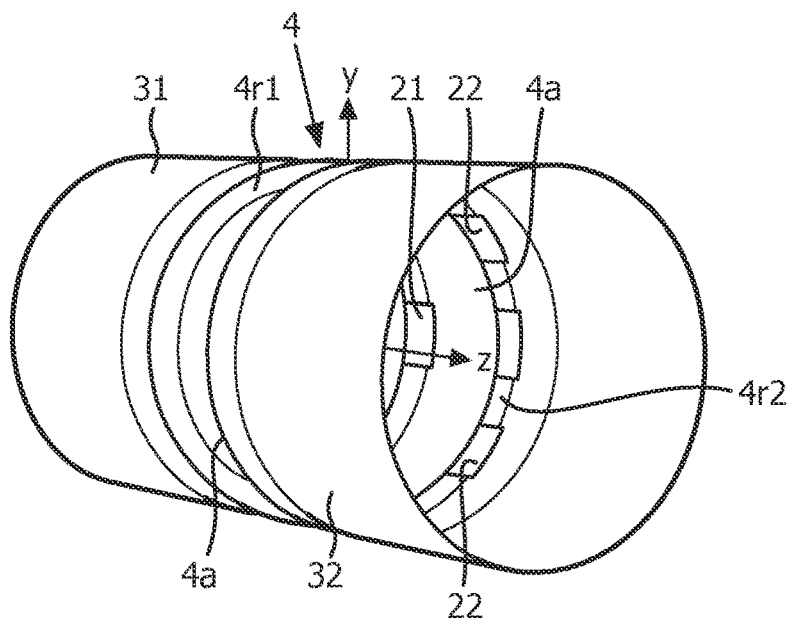
FIG. 2 shows a first embodiment of a TEM resonator system according to the invention.

FIG. 2 shows a first embodiment of a TEM resonator system according to the invention in a three dimensional view, comprising two TEM resonators and an intermediate RF shield 4 axially between both TEM resonators. A first TEM resonator comprises a plurality of first conductors 21 and a first cylindrical RF shield 31, wherein the second TEM resonator comprises a plurality of second conductors 22 and a second cylindrical RF shield 32. As can be seen in FIG. 2, the first and the second conductors 21, 22 are preferably each arranged with one of their ends proximal or adjacent to the intermediate RF shield 4 and preferably have an axial length which is considerably shorter than the axial length of the related RF shield 31, 32.

The intermediate RF shield 4 is composed of a longitudinal ring 4a (i.e. longitudinal in the direction of the z-axis), preferably a cylindrical ring, which has a diameter which is smaller than the diameter of the first and the second cylindrical RF shield 31, 32, and a first and a second radial ring (which have substantially no length in the longitudinal direction) 4r1, 4r2 at each one of the axial ends of the cylindrical ring 4a, wherein the inner and the outer diameter of both radial rings 4r1, 4r2 is dimensioned for galvanically connecting the cylindrical ring 4a with the adjacent first and second cylindrical RF shield 31, 32, respectively, of the first and the second TEM resonator. More in detail, the inner diameter of the first and the second radial ring 4r1, 4r2 is equal or substantially equal to the diameter of the longitudinal ring 4a, whereas the outer diameter of the first and the second radial ring 4r1, 4r2 is equal or substantially equal to the diameter of the first and the second cylindrical RF shield 31, 32, respectively. The diameter and/or the axial length of the longitudinal ring 4a is dimensioned for at least substantially electromagnetically decoupling the first and second TEM resonators from each other to a desired extent.

Figure 3:
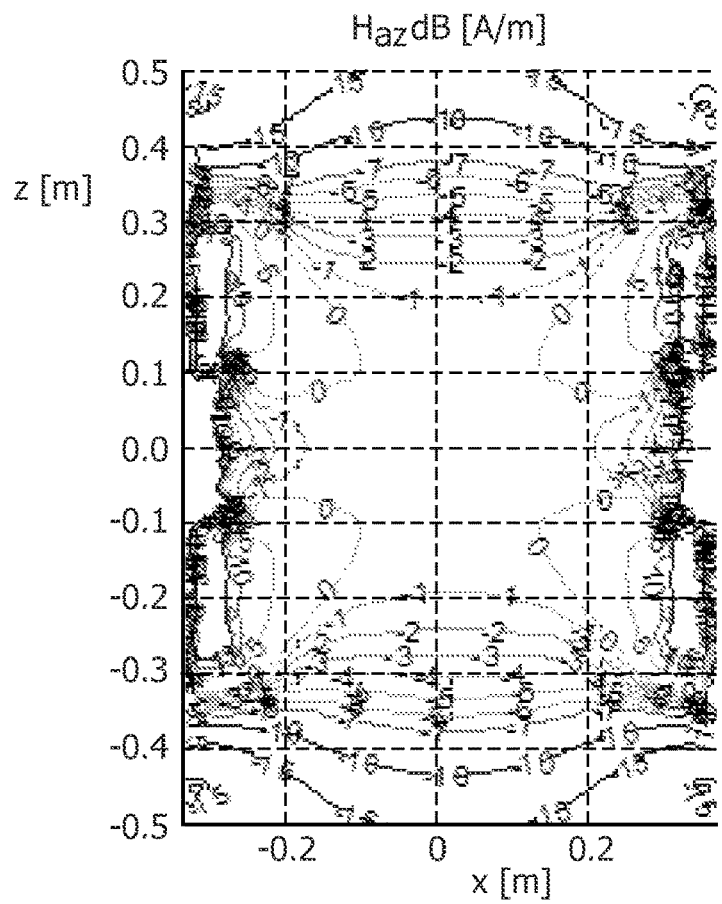
FIG. 3 shows a coronal RF field profile of the TEM resonator system according to FIG. 1.

FIG. 3 shows the coronal profile of the magnetic field $H_{az}$ (anti-clockwise rotating component of the magnetic field with respect to the z-axis) of the TEM resonator system according to FIG. 2 in the x/z-plane. The intermediate RF shield 4 extends between about z=0.1 meter and about z=−0.1 meter.

Figure 4:
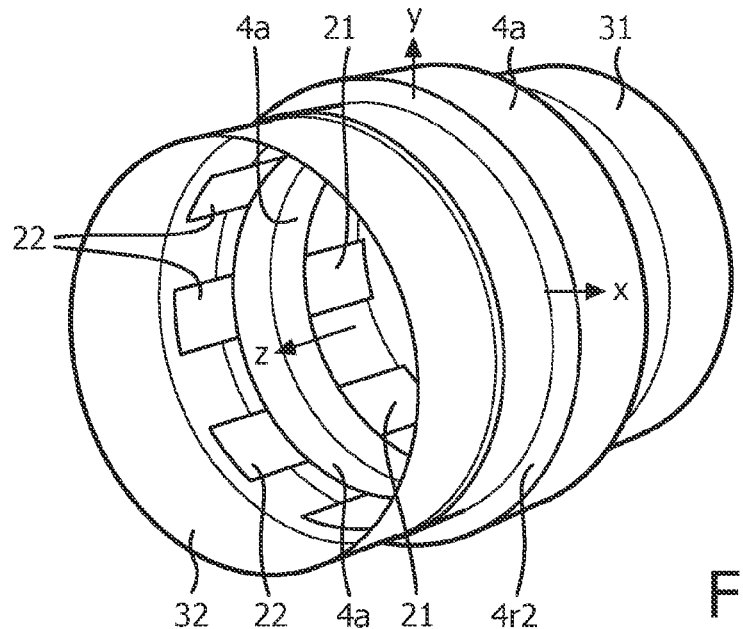
FIG. 4 shows a second embodiment of a TEM resonator system according to the invention.

FIG. 4 shows a second embodiment of a TEM resonator system according to the invention in a three dimensional view, again comprising two TEM resonators, wherein the same reference signs as in FIG. 2 denote the same or corresponding components.

Again, a first TEM resonator comprises a plurality of first conductors 21 and a first cylindrical RF shield 31, wherein the second TEM resonator comprises a plurality of second conductors 22 and a second cylindrical RF shield 32. Preferably, the first and the second conductors 21, 22 are each arranged with one of their ends proximal or adjacent to the intermediate RF shield 4.

The intermediate RF shield 4 is composed of a longitudinal ring 4a, preferably a cylindrical ring, which has a diameter which is greater than the diameter of the first and the second cylindrical RF shield 31, 32, and a first and a second radial ring 4r1, 4r2 at each one of the axial ends of the longitudinal ring 4a for connecting the same with the adjacent first and second cylindrical RF shield 31, 32, respectively, of the first and the second TEM resonator. More in detail, the inner diameter of the first and the second radial ring 4r1, 4r2 is equal or substantially equal to the diameter of the first and the second cylindrical RF shield 31, 32, respectively, whereas the outer diameter of the first and the second radial ring 4r1, 4r2 is equal or substantially equal to the diameter of the longitudinal ring 4a. Again, the diameter and/or the axial length of the longitudinal ring 4a is dimensioned for substantially electromagnetically decoupling the first and second TEM resonators from each other to a desired extent.

Figure 5:
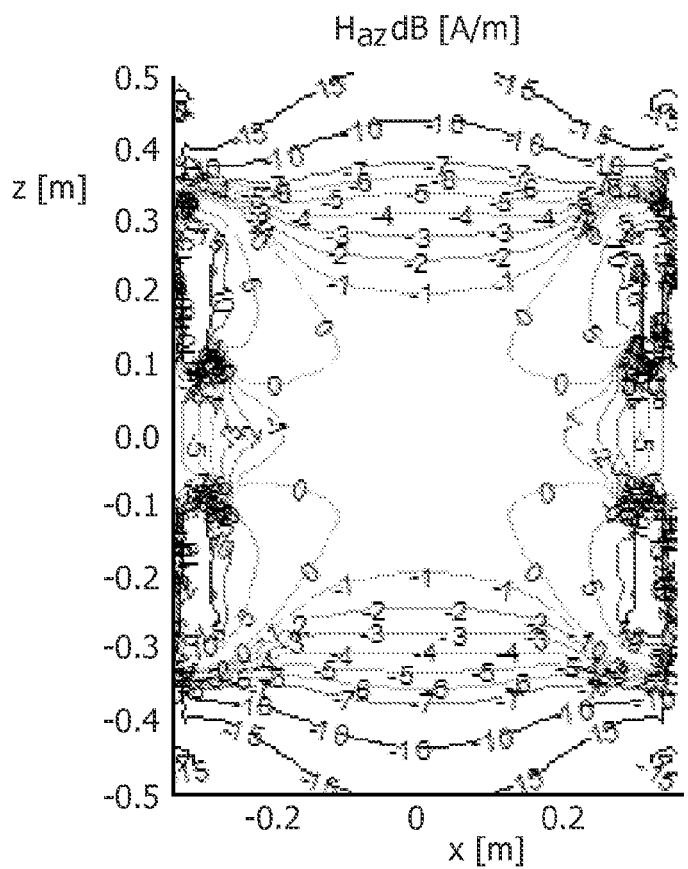
FIG. 5 shows a coronal RF field profile of the TEM resonator system according to FIG. 2.

FIG. 5 again shows the coronal profile of the magnetic field $H_{az}$ of the TEM resonator system according to FIG. 4 in the x/z-plane. The intermediate RF shield 4 extends between about z=0.1 meter and about z=−0.1 meter.

FIG. 6 shows various embodiments of a TEM resonator system according to the invention in partial longitudinal sections. Since, as mentioned above, the longitudinal sections of the embodiments are preferably the same in any of the circumferential directions around the longitudinal or z-axis (with the exception of the first and second conductors, which are distributed along this circumferential direction in a known manner) only the lower longitudinal sections below the longitudinal z-axis are shown in FIG. 6. The same reference signs in FIGS. 6(A) to 6(E) and in FIGS. 2 and 4 indicate the same or corresponding components.

Generally, as mentioned above, the intermediate RF shield is preferably composed of two or more ring sections, which each can be realized in the form of a radial ring which extends in a radial direction and which has a certain inner and outer diameter, or a longitudinal ring which has a certain axial length. Preferably, a radial ring (i.e. a disk-like ring) has no substantial extension in the axial direction, whereas a longitudinal ring preferably has no substantial extension in the radial direction, so that the inner and the outer diameter thereof is substantially identical.

In the following, it is assumed that the first and the second RF shield 31, 32 is exemplarily cylindrical and preferably circular in cross section, so that the radial and the longitudinal ring of the intermediate RF shield preferably also has a circular cross section, and the longitudinal ring is preferably a cylindrical ring. In other words, the cross sectional shape of the intermediate RF shield is preferably the same as the cross sectional shape of the first and the second RF shield of the first and the second TEM resonator, respectively, however, the dimensions, especially the diameters and the axial lengths of these can of course be different.

The same accordingly applies in case of an oval or elliptical cross section of the first and the second RF shield 31, 32 and of the corresponding intermediate RF shield.

Figure 6A:
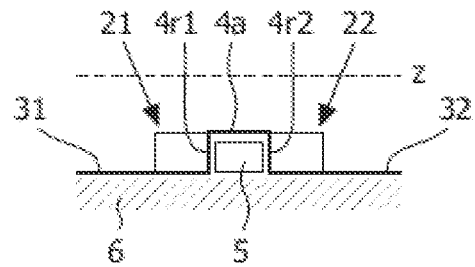
FIG. 6 shows several embodiments of TEM resonator systems according to the invention in partial longitudinal sections.

FIG. 6(A) shows a first embodiment of a TEM resonator system, wherein this Figure represents a partial longitudinal section through the embodiment shown in FIG. 2. However, this embodiment additionally comprises a PET detector arrangement or another supplementary element 5 for conducting or supporting an image generation of an examination object, within the intermediate section and at the radial outer side of the intermediate RF shield 4. As generally known, such a PET detector is usually realized in the form of a plurality of photon-detectors which are distributed around the z-axis for detecting gamma photons moving in opposite directions.

Further, FIG. 6(A) shows each one of the first and second conductors 21, 22 and the first and the second RF shield 31, 32 of the first and the second TEM resonator, respectively. At the outer circumference of the first and the second RF shield 31, 32, the gradient coil system 6 is schematically indicated.

The intermediate RF shield of the intermediate section is composed of a first and a second radial ring 4r1, 4r2 and a cylindrical ring 4a which is connected with and arranged axially between both radial rings 4r1, 4r2.

The first and the second radial ring 4r1, 4r2 both have an outer diameter which is equal to the diameter of the first and the second RF shield 31, 32, and an inner diameter which is smaller than the diameter of the first and the second RF shield 31, 32. The cylindrical ring 4a has a diameter which is equal to the inner diameter of the first and the second radial ring 4r1, 4r2 and an axial length which is substantially equal to the axial length of the intermediate section.

Apart from the fact, that, as mentioned above, the resulting dimensions of the intermediate RF shield, namely due to the above inner and outer diameters of the radial rings 4r1, 4r2 and the diameter of the cylindrical ring 4a, are selected such that a desired decoupling of the first TEM resonator from the second TEM resonator is obtained, the inner diameter of the first and the second radial ring 4r1, 4r2 and the diameter of the cylindrical ring 4a are preferably dimensioned such that the free space within the examination region remains large enough in order to receive an examination object.

Figure 6B:
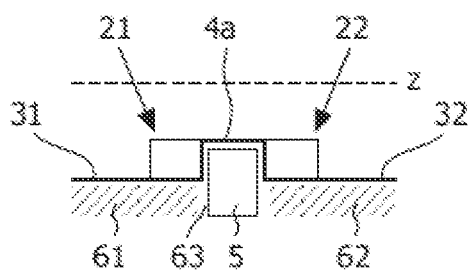

FIG. 6(B) shows a partial longitudinal section through a second embodiment of a TEM resonator system according to the invention.

In comparison to the first embodiment, the gradient coil system 6 is provided with a recess 63, or is divided into a first and a second gradient coil system 61, 62 with a gap 63 between both, in order to provide a space into which the supplementary element 5 can partly or totally be introduced. According to this embodiment, the supplementary element 5 is arranged at the radial outer side of the intermediate RF shield.

Figure 6C:
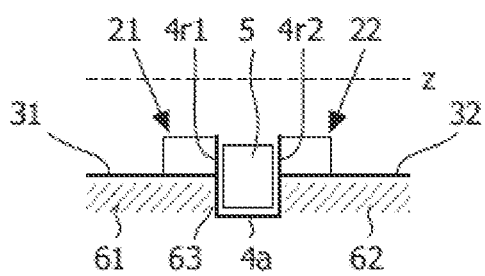

FIG. 6(C) shows a partial longitudinal section through a third embodiment of a TEM resonator system according to the invention.

In contrary to the second embodiment, the supplementary element 5 is arranged at the radial inner side of the intermediate RF shield. This is realized by composing the intermediate RF shield again by a first and a second radial ring 4r1, 4r2 and a cylindrical ring 4a which is connected with and arranged axially between both radial rings.

According to this embodiment, the first and the second radial ring 4r1, 4r2 both have an outer diameter which is greater than the diameter of the first and the second RF shield 31, 32, wherein the inner diameter of both radial rings is preferably smaller than (or equal to) the diameter of the first and the second RF shield 31, 32. Further, the diameter of the cylindrical ring 4a is greater than the diameter of the first and the second RF shield 31, 32 and preferably equal to the outer diameter of the first and the second radial ring 4r1, 4r2, wherein the axial length of the cylindrical ring 4a is again substantially equal to the axial length of the intermediate section.

Figure 6D:
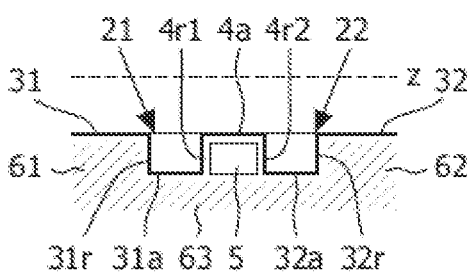

FIG. 6(D) shows a partial longitudinal section through a fourth embodiment of a TEM resonator system according to the invention.

In comparison to the second and third embodiment, the gradient coil system 61, 62 is provided with a recess (or gap) 63 which has a length in the axial (z–) direction of the TEM resonator system which is dimensioned for receiving the intermediate RF shield 4 and the first and the second conductors 21, 22 of the first and the second TEM resonator, respectively.

Accordingly, the first and the second RF shield 31, 32 is composed of a proximal part adjacent to the intermediate RF shield 4 and axially extending along and within the recess (or gap) 63, and a distal part which continues the proximal part of the first and the second RF shield 31, 32, respectively, in axial direction outside the recess (or gap) 63.

Generally, the proximal part of the first and the second RF shield 31, 32 preferably follows the shape of the recess 63 and adjoins the same as indicated in FIG. 6(D). Accordingly, the proximal part of the first RF shield 31 is composed of a longitudinal ring 31a, preferably a cylindrical ring, which is connected with the first radial ring 4r1 of the intermediate RF shield 4, and a radial ring 31r, which is connected between the longitudinal ring 31a and the distal part of the first RF shield 31. The proximal part of the second RF shield 32 is composed of a longitudinal ring 32a, preferably a cylindrical ring, which is connected with the second radial ring 4r2 of the intermediate RF shield 4, and a radial ring 32r, which is connected between the longitudinal ring 32a and the distal part of the second RF shield 32.

Further, according to this embodiment, the cylindrical ring 4a of the intermediate RF shield has a diameter which is equal to the diameter of the distal part of the first and the second RF shield 31, 32. However, this diameter can also be made smaller or greater than the diameter of the distal part of the first and the second RF shield 31, 32 as indicated in the first to third embodiment shown in FIGS. 6(A) to 6(C). Accordingly, the supplementary element 5 is arranged again at the radial outer or inner side of the intermediate RF shield as indicated in FIGS. 6(A) to 6(C).

Additionally, the recess (or gap) 63 can be provided with a further recess or gap for receiving the supplementary element 5 or a part thereof as indicated in FIGS. 6(B) and 6(C).

Figure 6E:
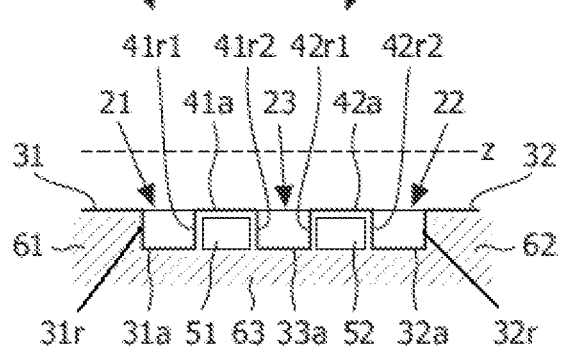

FIG. 6(E) shows a partial longitudinal section through a fifth embodiment of a TEM resonator system according to the invention.

This embodiment comprises three TEM resonators which are displaced along a common longitudinal or z-axis and which are again electromagnetically decoupled from each other by means of a first intermediate RF shield 41 between the first and the second TEM resonator and a second intermediate RF shield 42 between the second and the third TEM resonator, wherein exemplarily a first supplementary element 51 is arranged in the first intermediate section and a second supplementary element 52 is arranged in the second intermediate section.

Exemplarily, the gradient coil system 61, 62 is provided with a recess (or gap) 63 which has a length in the axial (z–) direction which is dimensioned such that it can receive the first and the second intermediate RF shield 41, 42 and the first, the second and the third conductors 21, 22, 23 of the first, the second and the third TEM resonator, respectively. However, instead of this, also a TEM resonator system comprising three or more TEM resonators can be provided with a gradient coil system 6; 61, 62 having no recess or gap as indicated in FIG. 6(A), or having at least one recess for receiving at least one of the supplementary elements (if provided) only, or for receiving only at least one of the first, the second and the third conductors 21, 22, 23 as indicated in FIGS. 6(B) to 6(D).

Exemplarily, according to FIG. 6(E) the first TEM resonator comprises first conductors 21 and a first RF shield 31 with a proximal part which is composed of a cylindrical ring 31a which is connected with a first radial ring 41r1 of the first intermediate RF shield 41, and a radial ring 31r which is connected between the cylindrical ring 31a and the distal part of the first RF shield 31. The second TEM resonator comprises second conductors 22 and a second RF shield 32 with a proximal part which is composed of a cylindrical ring 32a which is connected with a second radial ring 42r2 of the second intermediate RF shield 42, and a radial ring 32r which is connected between the cylindrical ring 32a and the distal part of the second RF shield 32. Further, a third TEM resonator is provided between the first and the second intermediate RF shield 41, 42 which comprises third conductors 23 and a third RF shield in the form of a cylindrical ring 33a which is connected between the second radial ring 41r2 of the first intermediate RF shield 41 and the first radial ring 42r1 of the second intermediate RF shield 42.

Preferably, the diameter of the cylindrical ring 33a of the third RF shield of the third TEM resonator is equal to the diameter of the cylindrical rings 31a, 32a of the first and the second RF shield of the first and the second TEM resonator, respectively.

The first and the second intermediate RF shield 41, 42 is provided as the intermediate RF shield 4 indicated in FIG. 6(D). Further, the diameters of the cylindrical rings 41a, 42a of the first and the second intermediate RF shield 41, 42 can be the same or different, and they can be equal to or smaller or greater than the diameters of the distal parts of the first and the second RF shield 31, 32 of the first and the second TEM resonator, respectively.

Additionally, the recess (or gap) 63 can be provided with one or two further recesses for partly or totally receiving one or both of the supplementary elements 51, 52 as indicated in FIG. 6(B).

Finally, it shall be mentioned that instead of or additionally to the above cylindrical rings 4a; 41a, 42a of the intermediate RF shield, also conical or cone-shape rings can be used which in the longitudinal sections according to FIG. 6 have an inclination in relation to the longitudinal or z-axis, or, in other words, which have a diameter which in one of the longitudinal directions decreases and in the opposite longitudinal direction increases. The longitudinal direction in which the diameter increases or decreases (i.e. the + or −z direction) can be selected according to the needs, and especially in order to obtain an optimum decoupling effect. Further, in the longitudinal section, such cone-shaped rings can have a straight or a curved shape.

FIG. 7 shows details of the embodiments of the TEM resonator systems shown in FIG. 6 with respect to different connection configurations of the first conductors 21 of the first TEM resonators to the first RF shields. The capacitive couplings of the second conductors 22 of the second TEM resonators to the second RF shields 32 (and accordingly of any further conductors of further TEM resonators to further RF shields) can be provided in the same or different ways.

Generally, the conductors can be coupled to the related RF shield as generally known. Preferably, the positions for these couplings are selected due to mechanical reasons.

FIG. 7(A) shows a part of the embodiments shown in FIGS. 6(A) and 6(B). According to this configuration, the first conductors 21 of the first TEM resonator are each coupled at their distal ends by means of a first capacitor C1 to the first RF shield 31 of the first TEM resonator, and at their proximal ends by means of a second capacitor C2 to the first radial ring 4r1 of the intermediate RF shield 4.

FIG. 7(B) shows an alternative to this configuration, according to which the first conductors 21 of the first TEM resonator are each coupled at both of their axial ends by means of a first and a second capacitor C1, C2, respectively, to the first RF shield 31 of the first TEM resonator.

FIG. 7(C) shows a part of the embodiments shown in FIGS. 6(D) and (E).

According to this configuration, the first conductors 21 are each coupled at both their axial ends by means of a first and a second capacitor C1, C2, respectively, to the first RF shield 31 and the cylindrical ring 4a; 41a of the intermediate RF shield 4; 41, respectively. Alternatively, the first and/or the second capacitor C1, C2 can also be coupled to the radial ring 31r of the first RF shield 31 and/or to the radial ring 4r1; 41r1 of the intermediate RF shield 4; 41.

FIG. 7(D) shows an alternative to this configuration, according to which the first conductors 21 of the first TEM resonator are each coupled at both of their axial ends by means of a first and a second capacitor C1, C2, respectively, to the cylindrical ring 31a of the proximal part of the first RF shield 31 of the first TEM resonator.

FIG. 8 shows a partial longitudinal section along the z-axis through the first embodiment of a TEM resonator system as indicated in FIG. 2 and in FIG. 6(A).

Apart from the first and the second conductors 21, 22 and the first and the second cylindrical RF shield 31, 32 of the first and the second TEM resonator, respectively, and the intermediate RF shield 4 which provides the intermediate section between both TEM resonators, also an optional supplementary element 5 is again indicated in this Figure which is positioned at the radial outer side of the intermediate RF shield 4. Further, a part of a gradient coil 6 is schematically indicated which surrounds the TEM resonator system as explained above and indicated in FIGS. 1 and 6(A). Exemplary dimensions of such a TEM resonator system for use in an MRI system or apparatus are as follows:

The overall axial length L of the TEM resonator system is about 1 meter. The diameter 2R of the first and the second cylindrical RF shield 31, 32 is equal and about 0.7 meter, wherein the diameter 2r of the cylindrical ring 4a of the intermediate RF shield is about 0.6 meter. The axial length $l_1$ of each of the first and the second conductors 21, 22 is about 0.1 meter, wherein their length in circumferential direction is about 5 cm, wherein typically more than or equal to 8 such conductors (preferably a multiple of 4) are preferably evenly distributed in the circumferential direction. The axial length $l_2$ of the intermediate section 4 (and by this of the cylindrical ring 4a) is about 0.45 meter.

Figure 9:
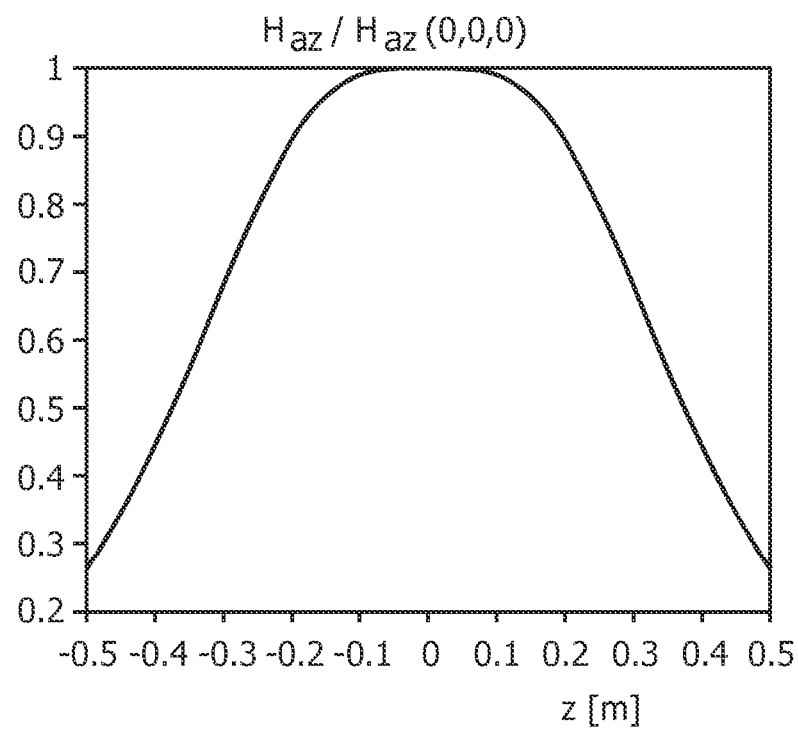
FIG. 9 shows a normalized axial RF field profile of the TEM resonator system according to FIG. 8.

FIG. 9 shows a normalized axial profile of the magnetic field $H_{az}$ of the TEM resonator system according to FIG. 8 having the above dimensions. It shows, that the field of view of such a TEM resonator system has a considerable extension in the z-direction even in case of first and second conductors 21, 22 which have a comparatively short length in the z-direction.

Figure 10:
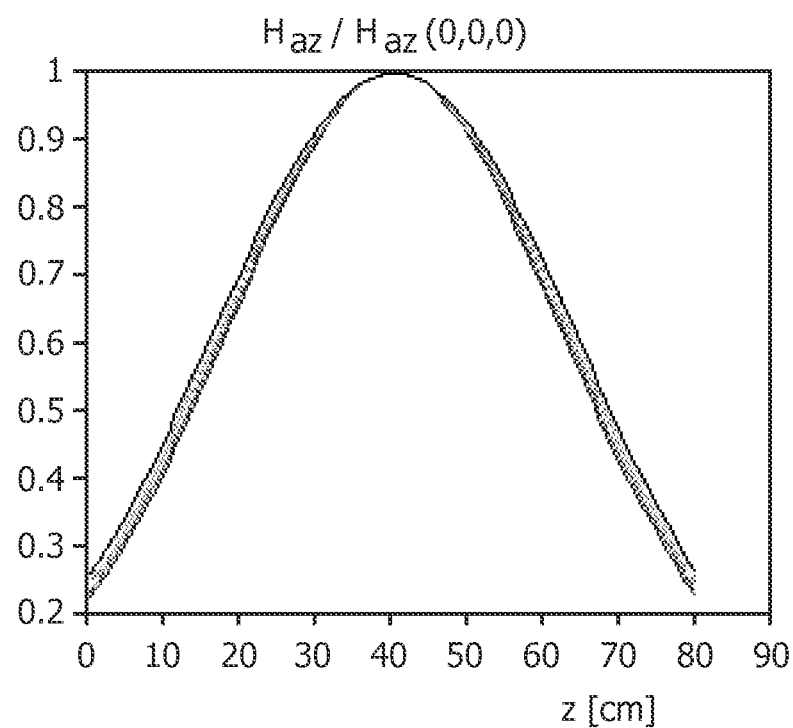
FIG. 10 shows normalized axial RF field profiles of conventional TEM resonators.

FIG. 10 shows normalized axial profiles of the magnetic field $H_{az}$ of several conventional TEM resonators having different axial lengths of the conductor structure between 25 cm and 42 cm and an axial length of the RF shield of about 1 meter. The curves which result for these different axial lengths are very close together. However, comparing FIGS. 9 and 10 shows that the field of view of a TEM resonator system according to the invention comprising the first and second TEM resonator has a larger extension in the z-direction than the field of view of a conventional TEM resonator having the same axial length of its RF shield and even greater lengths of its conductor structures.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A transverse electromagnetic (TEM) resonator system, comprising:
   a first TEM cylindrical volume resonator which comprises a first RF shield and a plurality of first conductors which are capacitively or galvanically coupled to the first RF shield;
   a second TEM cylindrical volume resonator which comprises a second RF shield and a plurality of second conductors which are capacitively or galvanically coupled to the second RF shield;
   a third TEM cylindrical volume resonator which comprises a third RF shield and a plurality of third conductors which are capacitively or galvanically coupled to the third RF shield; and
   a first intermediate RF shield which is positioned between the first TEM cylindrical volume resonator and the second TEM cylindrical volume resonator, and which capacitively or galvanically connects the first RF shield with the second RF shield, and
   a second intermediate RF shield is positioned between the second TEM cylindrical volume resonator and the third TEM cylindrical volume resonator,
   wherein the first, second, and third TEM cylindrical volume resonators are arranged and displaced from each other along a common longitudinal axis which is aligned with the respective longitudinal axis of each of the first TEM cylindrical volume resonator, the second cylindrical TEM volume resonator, and the third TEM cylindrical volume resonator,
   wherein the first intermediate RF shield includes a first radial ring, a second radial ring, and at least one longitudinal ring, the first and second radial rings and the at least one longitudinal ring being arranged coaxial with the common longitudinal axis,
   wherein at least one of: an inner radial dimension of the first radial ring, an outer radial dimension of the first radial ring, an inner radial dimension of the second radial ring, an outer radial dimension of the second radial ring, an axial length of the at least one longitudinal ring, and a radial dimension of the at least one longitudinal ring is dimensioned for at least substantially preventing electromagnetic radiation from emanating outward from between the first TEM cylindrical volume resonator and the second TEM cylindrical volume resonator toward a region surrounding the TEM resonator system.

2. The TEM resonator system according to claim 1, wherein at least one of: the inner radial dimension of the first radial ring, the outer radial dimension of the first radial ring, the inner radial dimension of the second radial ring, the outer radial dimension of the second radial ring, the axial length of the at least one longitudinal ring, and the radial dimension of the at least one longitudinal ring is dimensioned for at least substantially electromagnetically decoupling the first TEM cylindrical volume resonator from the second TEM cylindrical volume resonator.

3. The TEM resonator system according to claim 1, wherein the first RF shield, the second RF shield, the third RF shield, the first intermediate RF shield, and the second intermediate RF shield are circular or oval in cross sections at any positions along the common longitudinal axis.

4. The TEM resonator system according to claim 1, wherein the first conductors of the first TEM cylindrical volume resonator and the second conductors of the second TEM cylindrical volume resonator, respectively, are each arranged proximal or adjacent to the intermediate RF shield.

5. The TEM resonator system according to claim 1, wherein between the first TEM cylindrical volume resonator and the second TEM cylindrical volume resonator at least one of a Positron Emission Tomography (PET) detector arrangement and another supplementary element for conducting or supporting an image generation of an examination object is positioned.

6. The TEM resonator system according to claim 1, wherein the inner radial dimension of the first radial ring, the inner radial dimension of the second radial ring, the outer radial dimension of the first radial ring, and the outer radial dimension of the second radial ring are dimensioned for galvanically connecting the longitudinal ring with the adjacent first RF shield and second RF shield of the first TEM cylindrical volume resonator and the second TEM cylindrical volume resonator, respectively.

7. The TEM resonator system according to claim 1, wherein the radial dimension of the longitudinal ring of the intermediate RF shield is equal to or greater than a greatest radial dimension of the first RF shield or of the second RF shield of the first TEM cylindrical volume resonator and the second TEM cylindrical volume resonator, respectively.

8. A TEM resonator system comprising:
   a first TEM cylindrical volume resonator which comprises a first RF shield and a plurality of first conductors which are capacitively or galvanically coupled to the first RF shield;
   a second TEM cylindrical volume resonator which comprises a second RF shield and a plurality of second conductors which are capacitively or galvanically coupled to the second RF shield; and
   an intermediate RF shield which is positioned between the first TEM cylindrical volume resonator and the second TEM cylindrical volume resonator and which capacitively or galvanically connects the first RF shield with the second RF shield,
   wherein the first and second TEM cylindrical volume resonators are arranged and displaced from each other along a common longitudinal axis which is aligned with the respective longitudinal axis of each of the first TEM cylindrical volume resonator and the second cylindrical TEM volume resonator, wherein the intermediate RF shield includes a first radial ring, a second radial ring, and at least one longitudinal ring, the first and second radial rings and the at least one longitudinal ring being arranged coaxial with the common longitudinal axis, wherein at least one of: an inner radial dimension of the first radial ring, an outer radial dimension of the first radial ring, an inner radial dimension of the second radial ring, an outer radial dimension of the second radial ring, an axial length of the at least one longitudinal ring, and a radial dimension of the at least one longitudinal ring is dimensioned for at least substantially preventing electromagnetic radiation from emanating outward from between the first TEM cylindrical volume resonator and the second TEM cylindrical volume resonator toward a region surrounding the TEM resonator system, wherein at least one of the first RF shield and the second RF shield of the first TEM cylindrical volume resonator and the second TEM cylindrical volume resonator, respectively, comprises:
   a proximal part which is positioned adjacent the intermediate RF shield,
   a distal part which continues the proximal part in an axial direction, wherein the proximal part comprises a longitudinal ring having a radial dimension which is greater than a radial dimension of the distal part, and
   a radial ring which galvanically connects the longitudinal ring with the distal part of the at least one of the first RF shield and the second RF shield.

9. The TEM resonator system according to claim 1, in combination with a gradient coil system which coaxially surrounds at least a part of the TEM resonator system and which comprises a recess, wherein the first intermediate RF shield is at least partly positioned within the recess.

10. The TEM resonator system according to claim 9, wherein the second intermediate RF shield and the conductors of the first TEM cylindrical volume resonator, the second TEM cylindrical volume resonator, and the third TEM cylindrical volume resonator are all at least partly positioned within the recess.

11. A magnetic resonance (MR) imaging system comprising a TEM resonator system according to claim 1.

12. The TEM resonator system of claim 1, wherein the radial dimension of the longitudinal ring of the intermediate RF shield is less than a radial dimension of the first RF shield and a radial dimension of the second RF shield of the first TEM cylindrical volume resonator and the second TEM cylindrical volume resonator, respectively.

13. The TEM resonator system of claim 1, wherein the outer radial dimension of the first radial ring and the outer radial dimension of the second radial ring are each equal to a diameter of the first RF shield and equal to a diameter of the second RF shield.

14. The TEM resonator system of claim 13, wherein the inner radial dimension of the first radial ring and the inner radial dimension of the second radial ring are each less than the diameter of the first RF shield and less than the diameter of the second RF shield.

15. The TEM resonator system of claim 1, wherein the radial dimension of the at least one longitudinal ring is equal to a least radial dimension of the first RF shield and equal to the least radial dimension of the second RF shield.

16. The TEM resonator system of claim 8, wherein the outer radial dimension of the first radial ring of the intermediate RF shield is equal to the radial dimension of the proximal part which comprises the longitudinal ring of the first RF shield.

* * * * *